(12) United States Patent
Werthen et al.

(10) Patent No.: US 8,742,251 B2
(45) Date of Patent: Jun. 3, 2014

(54) MULTI-SEGMENT PHOTOVOLTAIC POWER CONVERTER WITH A CENTER PORTION

(75) Inventors: Jan-Gustav Werthen, Cresskill, NJ (US); Qiang Liu, San Jose, CA (US); Seniwati Widjaja, Cupertino, CA (US); Ta-Chung Wu, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 1370 days.

(21) Appl. No.: 11/958,712

(22) Filed: Dec. 18, 2007

(65) Prior Publication Data

US 2011/0108082 A1    May 12, 2011

Related U.S. Application Data

(60) Provisional application No. 60/871,108, filed on Dec. 20, 2006, provisional application No. 60/871,125, filed on Dec. 20, 2006.

(51) Int. Cl.
    *H01L 31/042*    (2006.01)
    *H02N 6/00*    (2006.01)
    *H01L 31/0304*    (2006.01)

(52) U.S. Cl.
    USPC ............................ 136/249; 136/255; 136/262

(58) Field of Classification Search
    USPC ............................ 257/466; 136/249, 255, 262
    See application file for complete search history.

(56) References Cited

U.S. PATENT DOCUMENTS

| 4,219,368 | A  | * | 8/1980 | David | 136/249 |
| 5,342,451 | A  |   | 8/1994 | Virshup | |
| 6,252,155 | B1 | * | 6/2001 | Ortabasi | 136/246 |
| 6,372,980 | B1 | * | 4/2002 | Freundlich | 136/255 |
| 6,686,533 | B2 | * | 2/2004 | Baum et al. | 136/244 |
| 2006/0048811 | A1 | * | 3/2006 | Krut et al. | 136/249 |
| 2006/0144435 | A1 | * | 7/2006 | Wanlass | 136/255 |
| 2007/0131275 | A1 | * | 6/2007 | Kinsey et al. | 136/255 |

OTHER PUBLICATIONS

Wiring solar modules and batteries. Solatron Technologies. Feb. 6, 2003. <http://web.archive.org/web/20030206212224/http://www.partsonsale.com/learnwiring.htm>.*

* cited by examiner

*Primary Examiner* — Jonathan Johnson
*Assistant Examiner* — Andrew Golden
(74) *Attorney, Agent, or Firm* — Matthew A. Pequignot; Pequignot + Myers LLC

(57) ABSTRACT

The invention provides a photovoltaic power converter that includes a plurality of spatially separated device segments supported by a substrate, wherein the device segments are arranged in a circular pattern wherein a first group of the device segments consisting of one or more of the device segments is centrally positioned and is surrounded by a second group of the device segments comprising at least two device segments and wherein two or more of the plurality of the device segments are connected in series for developing a voltage when radiation of selected wavelengths is incident on the device.

15 Claims, 9 Drawing Sheets

MULTI-SEGMENT PHOTOVOLTAIC POWER CONVERTER WITH A CENTER PORTION

CROSS-REFERENCE TO RELATED APPLICATIONS

The present invention claims priority from U.S. Provisional Patent Application No. 60/871,108 filed Dec. 20, 2006, entitled "InP-based Photovoltaic Power Converter for Long-Distance Power Delivery (>>1km)", and U.S. Provisional Patent Application No. 60/871,125 filed Dec. 20, 2006, entitled "Novel Ultra-High Efficiency Photovoltaic Power Converter for High Power Delivery", both of which are incorporated herein by reference.

TECHNICAL FIELD

The present invention generally relates to devices that convert optical power into electrical power, and in particular relates to segmented semiconductor optical power converting devices with a centrally located segment or segments.

BACKGROUND OF THE INVENTION

Devices for converting optical power into electrical power are used in many applications, perhaps most known of which is the conversion of sunlight into electricity, for which silicon-based photovoltaic cells, also referred to as photocells or solar cells, are typically used. For this type of application, an array of photovoltaic cells with a relatively large total photosensitive area is typically used.

Another application for optical power converters that has recently emerged is a remote optical powering of electronic modules. In this type of applications, optical power may be provided by a high-power laser and delivered to the module via an optical fiber, where it is converted into an electrical power signal. In such applications, the optical light is typically comes in the form of a well-confined infra-red beam of high intensity, typically in the wavelength range between about 900 nm and 1600 nm corresponding to a low absorption window of typical optical fibers. The optical power converter for such applications has a relatively small, preferably circular photosensitive area of a few square millimeters or less, and is based on compound semiconductors such as InP, GaAs and their alloys, that are more suitable for absorbing infra-red light than silicon. An example of such a GaAs device is disclosed in U.S. Pat. No. 5,342,451 issued to Virshup, which is incorporated herein by reference.

As described in the Virshup patent and illustrated in FIG. 1, which reproduces FIG. 2 of Virshup, a typical semiconductor optical power converter includes a pn junction 20 formed between a base layer 16, which may typically be n-type, and an emitter layer 18, which may typically be p-type. The base and emitter layers 16, 18 are sandwiched between a highly conductive buffer layer 14 placed on an isolating substrate 12, and a highly conductive, optically transparent window layer 22, which can be followed by a thicker conducting layer 24. A cap layer (not shown in FIG. 1) is placed on top of the window layer and electrical contacts (not shown in FIG. 1) such as metal grid lines are deposited onto this cap layer. Between the metal grid lines, which are typically as narrow as 3 microns, the cap layer is etched away, allowing the incident light to penetrate through the transparent window layer and be absorbed by the underlying pn junction 20. In order to complete the circuit, the n-portion of the pn junction has to be reached, typically by an etching technique. The depth of this etch is usually a few microns to ensure that the n-type layer 16 is reached. Once metal has been deposited onto this exposed n-type layer, connection to both the n-type and the p-type polarities can be made. As photons are incident and absorbed by the pn junction 20, carriers are generated, and, in the presence of the electrical field created by the pn junction, swept away and collected at the electrical contacts, creating a voltage difference between them. By connecting to an external circuit, electrical power can be extracted.

An open circuit voltage that a single pn junction can deliver is limited by the bandgap of the used semiconductor material, and is typically less than 1 volt. By connecting a number of these pn junctions in series in a lateral configuration, individual voltages are summed to produce an output voltage that can reach 12 volts or more. In order to create such individual pn junction elements, etching between adjacent segments is typically done. This has to be deep enough to isolate the pn junctions from each other, with a typical depth of about 25 microns. To complete the series connections, air bridges are formed between adjacent pn junctions. One side of such an air bridge is connected to the exposed n-type portion of the pn junction; the other to the p-type portion of the neighbouring pn junction.

For applications wherein the optical power is delivered by a confined optical beam with a circular cross-section, such as that emanating from an optical fiber. As illustrated in FIG. 2, which is reproduced from FIG. 3 of the Virshup patent, these multiple pn junctions are typically created by dividing a circular photosensitive area of a semiconductor chip into a plurality of pie-shaped device segments 28 that are separated from each other by etched trenches 26, and connected in series by the interconnecting bridges 40; although 6 segments are shown, in a typical device there may be anywhere from two to sixteen or more such segments.

One drawback of the device shown in FIG. 2 is that it has a hole in the center of the photosensitive structure where the trenches 26 converge; accordingly, light that impinging the device center is lost. Generally, the efficiency with which light is converted into electricity by each portion of the device is proportional to the ratio of the photosensitive area to the trench area; in the device shown in FIG. 2, this ratio has a maximum at the periphery of the photosensitive area, gradually decreasing towards the device center 99, and is substantially zero in the device center 99. Since a typical light beam, such as a beam emanating from an optical fiber, has an approximately Gaussian power distribution with a maximum intensity at the center of the beam, the pie-shaped segmentation illustrated in FIG. 2 results in the loss of a significant portion of incoming light, and therefore negatively affects the overall power conversion efficiency of the device.

A further drawback of the prior art is also related to the non-uniform distribution of the optical power across the light beam that is incident on the power converter device. With so much of the light energy striking a relatively small area about the center 99 of the power converter, many of the photo-generated carriers are generated far from the electrical contacts 40 that are located at the device edges; as a result, an internal resistance of the device layers starts to play a significant role as the total light intensity increases. The increased current is a direct result of the increased light intensity. This current has to make its way through resistive material to the edges, and the more current the more voltage losses caused by the current encountering resistance. With increasing light intensity, the internal resistance of the device results in a voltage drop within the device as the photo-generated current increases, thereby reducing the output device voltage and the electrical power that the device can provide to external circuitry. Consequently, the higher the light intensity, the higher the loss in the output voltage typically observed for the prior art semiconductor power converters.

Another disadvantage of the prior art power converters is that they are geared exclusively for power conversion, while real-life applications may require to combine both optical power conversion and optical data extraction in one module. However, the tasks of optical power conversion and data extraction from modulated light beams result in contradictory design requirements when applied to the prior-art devices such as that illustrated in FIG. 2; for example, a typical requirement in optical power conversion is to maximize the converted power, which demands using devices with relatively large photosensitive area. On the other hand, high-speed optical data communications, for example those with modulation bandwidth in excess of 0.1-1 MHz, will typically require the use of small-area photodetectors that have low parasitic capacitance. The modulation bandwidth of the prior art segmented optical converter of FIG. 2 can be further decreased due to the serial connection of the device segments, which increases the internal device resistance resulting in higher RC values.

An object of the present invention is to overcome at least some of the shortcomings of the prior art by providing an improved optical power converter that has an improved light conversion efficiency for Gaussian beams and lower internal resistance.

Another object of the present invention is to provide an optical power converter that can be used for both the optical power conversion and data detection.

SUMMARY OF THE INVENTION

In accordance with the invention, a photovoltaic power converter is provided comprising: a substrate of a semiconductor material; a first multilayer structure supported by the substrate and comprising a first base layer of a semiconductor material of a first conductivity type disposed over the substrate, a first emitter layer of a semiconductor material of a second conductivity type opposite to the first conductivity type disposed over the first base layer so as to form a p-n junction region, and a first conducting layer of the second conductivity type disposed over the first emitter layer; a plurality of trenches extending through the first multilayer structure and partially extending into the substrate so as to form a plurality of spatially separated device segments supported by the substrate. The device segments are arranged in a circular pattern wherein a first group of the device segments consisting of one or more of the device segments is centrally positioned and is surrounded by a second group of the device segments comprising at least two device segments. Two or more of the plurality of the device segments comprise a first metal contact in electrical communication with the first base layer within the device segment, and a second metal contact disposed over the first emitter layer within the device segment in electrical communication therewith. Electrical interconnects are provided for electrically connecting in series the two or more of the device segments by connecting each but one first metal contact thereof to an adjacent second metal contact, for developing a voltage between those of the first and second metal contacts of the two or more of the device segments, which remain unconnected to any of the other second or first metal contacts, respectively, when radiation of selected wavelengths is incident on the first emitter layer.

In accordance with one aspect of this invention, the two or more of the device segments comprise device segments of the first and second groups.

In accordance with another aspect of this invention, the two or more of the device segments comprise the device segments of the second group but not the device segments of the first group. The first group of the device segments may consist of a center segment that is positioned in the center of a ring device section formed by the device segments of the second group connected in series.

The photovoltaic power converter according to this aspect of the invention may comprise a second multilayer structure disposed over the first multilayer structure within the center device segment, the second multilayer structure comprising: a second base layer of a semiconductor material of the first conductivity type disposed over the first conducting layer; a second emitter layer of a semiconductor material of the second conductivity type disposed over said second base; a third metal contact in electrical communication with the second base layer; and, a forth metal contact in electrical communication with the second emitter layer. In one aspect of the invention, each of the third and forth metal contacts extend outwardly across the ring device section and are electrically insulated from the device segments thereof for connecting to an external circuit independently of the device segments of the second group, with one or more current blocking layers interposed between each of the third and forth contacts and the first multilayer structure within the ring device section.

In one embodiment of the invention, the substrate comprises semi-insulating GaAs; second base layer comprises n-doped GaAs having a donor impurity concentration in the range of $5\times10^{17}$ to $2\times10^{18}$ cm$^{-3}$ and has a thickness in the range of 1 to 3 μm; the intrinsic layer comprises undoped GaAs having a doping level less than $10^{15}$ cm$^{-3}$ and has a thickness in the range of 0.5 to 1.5 μm; the second emitter layer comprises p-doped GaAs having an acceptor impurity concentration in the range $5\times10^{17}$ to $2\times10^{18}$ cm$^{-3}$ and has a thickness in the range of 0.5 to 1.5 μm; the first base layer comprises n-doped GaAs having a donor impurity concentration in the range of $2\times10^{17}$ to $2\times10^{18}$ cm$^{-3}$ and has a thickness in the range of 1 to 3 μm; the first emitter layer comprises p-doped GaAs having an acceptor impurity concentration in the range of $5\times10^{17}$ to $2\times10^{19}$ cm$^{-3}$ and has a thickness in the range of 0.2 to 1 μm. A buffer layer of n-doped GaAs having a thickness in the range of 1 to 10 μm and a donor impurity concentration in the range $5\times10^{17}$ to $2\times10^{18}$ cm$^{-3}$ is interposed between the substrate and the first base layer; a conducting layer of a p-doped alloy of one of AlGaAs and InGaP is interposed between the first emitter layer and the second base layer and having a thickness in the range of 1 to 3 μm and an acceptor impurity concentration in the range $2\times10^{18}$ to $2\times10^{19}$ cm$^{-3}$.

In another embodiment of the invention, the substrate comprises semi-insulating InP; the first base layer comprises n-doped InGaAs lattice matched to InP and having a donor impurity concentration in the range of $5\times10^{17}$ to $1\times10^{19}$ cm$^{-3}$, and has a thickness in the range of 1 to 3 μm; the first emitter layer comprises p-doped InGaAs lattice matched to InP and having an acceptor impurity concentration in the range $5\times10^{17}$ to $1\times10^{19}$ cm$^{-3}$ and has a thickness in the range of 0.5 to 1.5 μm; a buffer layer of n-doped InP is interposed between the substrate and the first base layer having a thickness in the range of 5 to 10 μm and a donor impurity concentration in the range $5\times10^{17}$ to $2\times10^{18}$ cm$^{-3}$; a conducting layer of a p-doped InP is interposed between the first emitter layer and the second base layer and having a thickness in the range of 1.5 to 2.5 μm and an acceptor impurity concentration in the range $2\times10^{18}$ to $2\times10^{19}$ cm$^{-3}$; the second base layer comprises n-doped InGaAsP having a donor impurity concentration in the range of $5\times10^{17}$ to $2\times10^{18}$ cm$^{-3}$ and has a thickness in the range of 1 to 2 µm; the intrinsic layer comprises undoped InGaAsP having a doping level less than $10^{15}$ cm$^{-3}$ and has a thickness in the range of 0.5 to 1.5 µm; and, the second emitter layer comprises p-doped InGaAsP having an acceptor impurity concentration in the range $5 \times 10^{17}$ to $5 \times 10^{18}$ cm$^{-3}$ and has a thickness in the range of 0.5 to 1.5 µm.

BRIEF DESCRIPTION OF THE DRAWINGS

The invention will be described in greater detail with reference to the accompanying drawings which represent preferred embodiments thereof and in which like reference labels are used to indicate like elements, wherein.

DETAILED DESCRIPTION

Exemplary embodiments of the photovoltaic power converter (PPC) of the present invention will now be first described with reference to FIGS. 3, 4 and 5.

Figure 3:
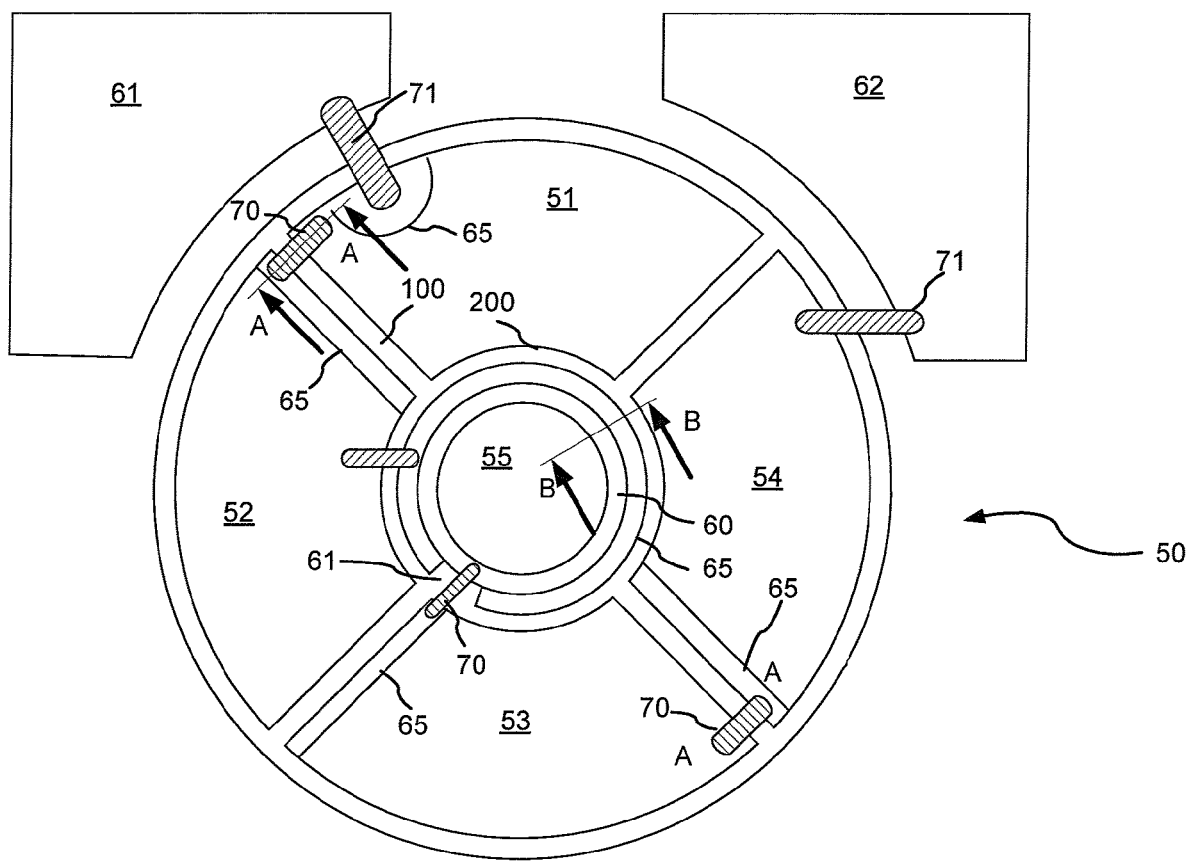
FIG. 3 is a plan view of a photovoltaic power converter having a center section according to one embodiment of the present invention.

Referring first to FIGS. 3, the PPC 50 includes a plurality of device segments 51-55 arranged in a circular pattern, with a central portion, or segment 55 and a plurality of segments 51-54 that are disposed around the central segment 55 surrounding said central segment and forming a ring-like structure. The segments 51-54, which will also be referred to herein as the ring segments, and the central segment 55 are separated from each other by narrow trenches 100, 200. A circular, or more generally, endless trench 200 separates the central segment 55 from the ring segments 51-54, while the trenches 100 extend radially therefrom to separate the ring sections 51-54 from each other. The trenches 100, 200 are etched in an epitaxially grown semiconductor wafer using one of known in the art etching techniques for etching high aspect ratio features such as Reactive Ion Etching (RIE). Electrical interconnects 70 in the form of air bridges connect the segments 51-55 in series between contact pads 61 and 62, as described hereinbelow in further detail, so that a voltage developed across each of the segment when the device is illuminated with light of suitable wavelengths is summed to generate a respectively higher output voltage $V_{out}$ between the contact pads 61 and 62. Although the PPC 50 is shown in FIG. 3 to have four ring segments, other embodiments may have either lower or, greater number of ring segments so as to provide a higher output voltage. Generally, devices based on lower energy band gap materials will require a greater number of device segments to achieve a certain value of the desired output voltage $V_{out}$, for example 6V. For example, InP based devices described hereinbelow may have 12 or greater device segments, while 5 device segments may be suitable for GaAs based devices.

Figure 4:
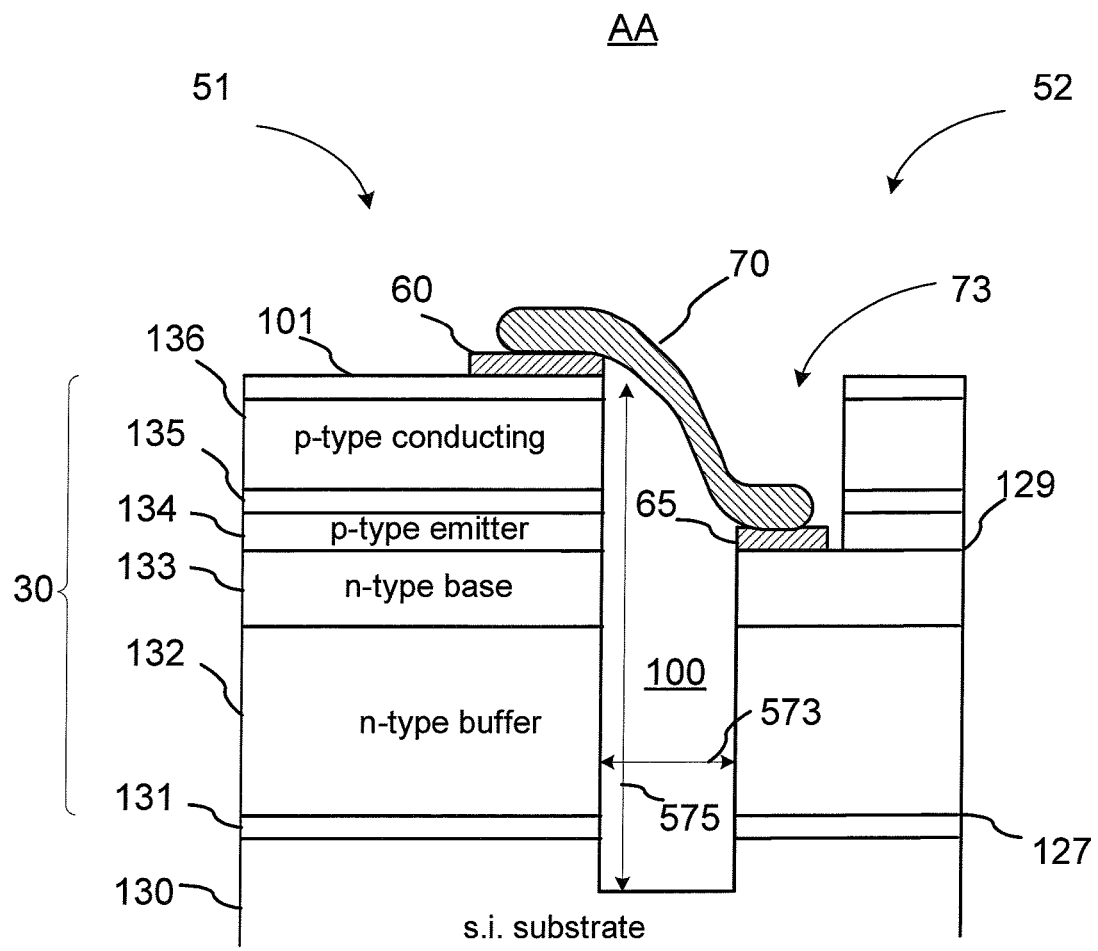
FIG. 4 is a cross-sectional view of the photovoltaic power converter of FIG. 3 as taken along line A-A, illustrating an exemplary layer structure thereof.
Figure 5:
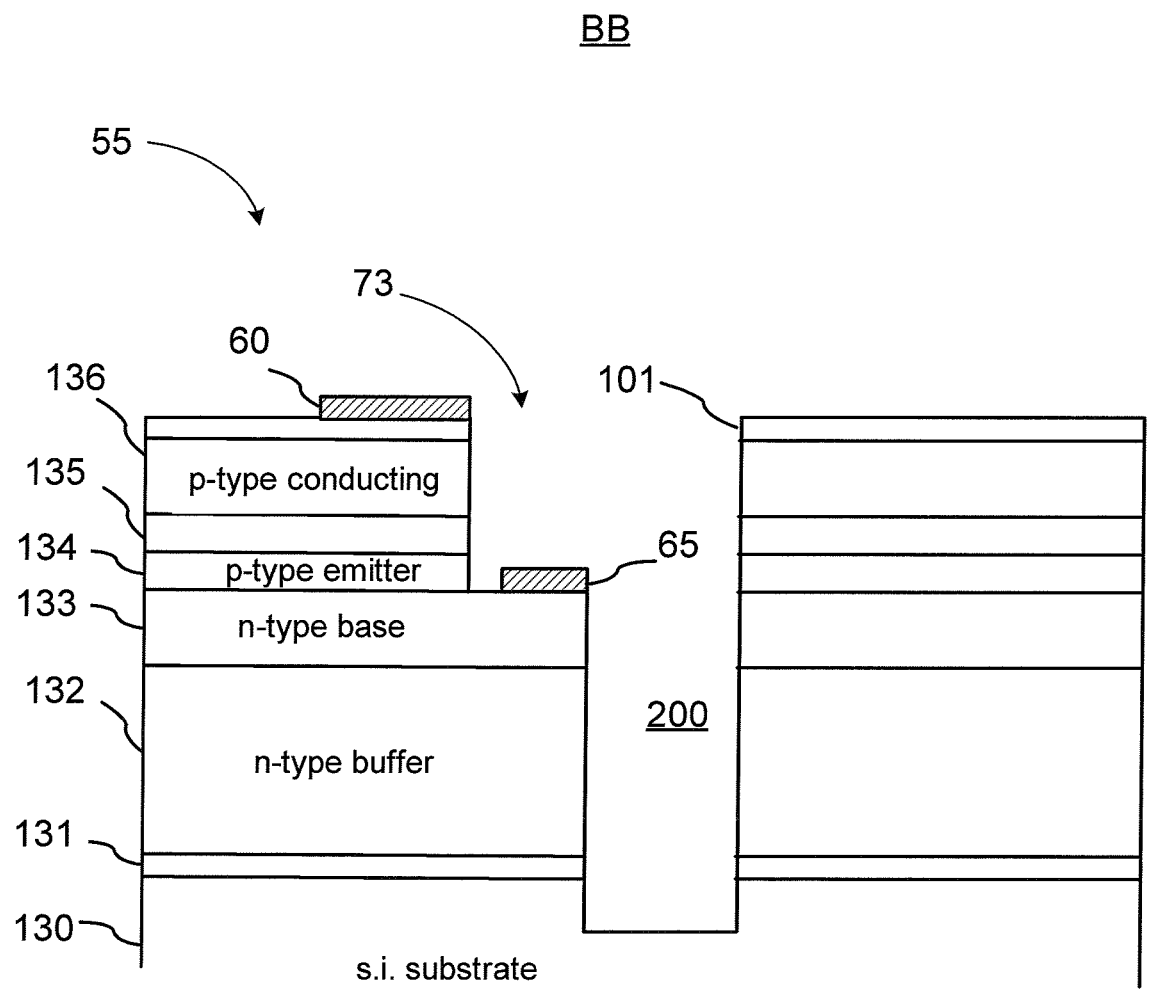
FIG. 5 is a cross-sectional view of the photovoltaic power converter of FIGS. 3 and 4 as taken along line B-B of FIG. 3.

Turning now to FIG. 4, a cross-section of a portion of the PPC 50 along a line 'A-A' is shown to illustrate a layer structure of the PPC 50; it includes a semi-insulating or insulating substrate 130, a first current blocking layer 131, and a first multilayer structure 30, which in turn includes a buffer layer 132 of a first semiconductor material having a first conductivity type, a first base layer 133 of the first semiconductor material of the first conductivity type having a first energy bandgap, a first emitter layer 134 of a second semiconductor material of a second conductivity type opposite to the first conductivity type so as to form a p-n junction region 129 therebetween, the first emitter layer having a second bandgap, and a conducting layer 136 of the third semiconductor material having the second conductivity type. The first and second semiconductor materials are such that they absorb the incident light and generate photo-induced minority carriers in the emitter and base layers, which are then pulled by an electrical field of the p-n junction 129 in the adjacent emitter or base layer where they become majority carriers and charge the first emitter and base layers 134, 133, which are referred to hereinafter as the first active layers, with electrical charges of opposite polarities to create a photo-induced voltage. The third semiconductor material of the conducting layer 136 is transparent to the incident light and has a third band gap that is wider than the bandgaps of any of the first and second semiconductor materials forming the first base and emitter layers 133, 134. An optional contact or cap layer 101 of the second conductivity type that is transparent to the incident light may be deposited on top of the conducting layer 136 to assist in forming a good ohmic contact with first metal contacts 60 and grid lines (not shown). The terms "bandgap" and "energy bandgap" are used herein interchangeably to refer to the energy difference between the top of the valence band and the bottom of the conduction band of a semiconductor material.

The buffer layer 132 underlying the base layer 133 is relatively thick as compared to both the base and emitter layers 133, 134. In operation, the buffer layer serves as a second conducting layer assisting the flow of photogenerated carriers of the first polarity to a respective first metal contact 65; it should have a low sheet resistance preferably less than 1 ohm-cm$^2$. Both the substrate 130 and the first current blocking layer 131 may be of the first semiconductor material, i.e. same as the buffer and first base layers 132, 133, to assist in the epitaxial growth of the high-quality base layer 133 having low density of defects that would give rise to non-radiative recombination of the photo-induced carriers. The second semiconductor material, i.e. the material of the first emitter layer has preferably the same or higher energy band gap and substantially the same lattice constant as the first semiconductor material, and may be same as the first semiconductor material.

The substrate 130 should have high resistivity so as to resist leakage therethrough of the photo-generated carriers that flow in the buffer layer 132, which would reduce the output voltage of the PPC 50 and thereby degrade the PPC's performance. Since high-quality substrates of most suitable semiconductor materials that are undoped and have intrinsic conductivity are only semi-insulating, the substrate 130 may be an intrinsic or semi-insulating substrate of the first semiconductor material preferably having a resistivity of no less than $10^7$ ohm-cm. In the selection of substrates, a good choice is an undoped GaAs or InP substrate having no more than $10^{15}$ cm$^{-3}$ of background doping. Such background doping will ensure no direct current conduction in the substrate but does not prevent undesirable photo-induced current conduction in the substrate.

Advantageously, the first current blocking layer 131, which is according to the invention interposed between the semi-insulating substrate 130 and the buffer layer 132, has the second conductivity type that is opposite to the first conductivity type of the buffer layer 132, and therefore forms a p-n junction 127 with the buffer layer 132 that blocks the majority carries of the buffer layer 132 from flowing into the substrate 130, so as to further suppresses the leakage currents between the device segments through the substrate 130. The p-n junction 127 between the current blocking layer 131 and the buffer layer 132 is referred to hereinafter as the current blocking junction 127 or the first current blocking junction.

In the embodiments described herein the first conductivity type is the n-type conductivity, and the second conductivity type is the p-type conductivity, although in other embodiments of the invention the first conductivity type may be the p-type conductivity, and the second conductivity type may be the n-type conductivity. The n-type refers to the conductivity type of a semiconductor material doped with doping material or materials giving rise to donor impurities wherein the majority carriers are electrons, and the p-type refers to the conductivity type of a semiconductor material doped with doping material or materials giving rise to acceptor impurities wherein the majority carriers are holes. The terms "n(p)-type" and "n(p)-doped" are used herein interchangeably when refer to as semiconductor material of a respective conductivity type. The term 'doping level' used herein below refers to a net concentration of donor or acceptor impurities in the respective n-type or p-type semiconductor material.

The first base layer may be doped so as to have a donor impurity concentration in the range of $5\times10^{17}$ to $1\times10^{19}$ cm$^{-3}$. The first base layer may be doped so as to have an acceptor impurity concentration greater than $5\times10^{17}$ cm$^{-3}$, or preferably in the range of $2\times10^{18}$ to $1\times10^{19}$ cm$^{-3}$, and most preferably in the range of $3\times10^{18}$ to $5\times10^{18}$ cm$^{-3}$. In other embodiments, the first base layer may have a donor impurity concentration that is increasing away from the junction region 129 towards the current blocking layer 131 from less than $2\times10^{17}$ cm$^{-3}$ to at least $2\times10^{18}$ cm$^-$. Similarly, the emitter layer may have an acceptor impurity concentration that is increasing away from the junction region 129 towards the conducting layer 136 from a level of less than $2\times10^{17}$ cm$^{-3}$ to at least $2\times10^{18}$ cm$^{-3}$.

In a first preferred embodiment, the semiconductor materials of the substrate 130, the current blocking layer 131, the buffer layer 132, the first base and emitter layers 133, 134 are gallium arsenide (GaAs), the semiconductor material of the conducting and optional window layers 136, 135 is one or both of indium gallium phosphate (InGaP) and aluminum gallium arsenide (AlGaAs), and of the optional cap layer is GaAs.

More particularly, the substrate 130 is formed from substantially undoped GaAs having the background doping level no greater than $10^{-15}$ cm$^{-3}$ and may have a thickness of several hundred microns (μm), for example in the range of 350 μm to 650 μm. The current blocking layer 131 epitaxially grown on the substrate 130 is a p-type GaAs having an acceptor impurity concentration in the range of $5\times10^{17}$ cm$^{-3}$ to $1\times10^{19}$ cm$^{-3}$ or for example about $2\times10^{18}$ cm$^{-3}$ and a thickness in the range of 0.2 to 0.3 microns for example 0.25 microns. The buffer layer 132 is an n-type highly-doped GaAs epitaxially grown on the current blocking layer 131 and having a donor concentration in the range of $5\times10^{17}$ cm$^{-3}$ to $2\times10^{18}$ cm$^{-3}$ and a thickness in the range of 1 to 10 microns for example 5 μm. The first base layer 133 is epitaxially grown on the buffer layer 132, is also of n-type GaAs having a donor concentration in the range of $5\times10^{17}$ cm$^{-3}$ to $2\times10^{18}$ cm$^{-3}$, for example $1\times10^{18}$ cm$^{-3}$ and a thickness of approximately 3 microns. The first emitter layer 134 is epitaxially grown on the first base layer 133 and is of p-type GaAs having an acceptor impurity concentration in the range of $2\times10^{18}$ cm$^{-3}$ to $1\times10^{19}$ cm$^{-3}$, and preferably in the range of $3\times10^{18}$ cm$^{-3}$ to $5\times10^{18}$ cm$^{-3}$ and a thickness in the range of 0.2 to 1 micron, for example 0.8 μm. The p-n junction 129 is formed between the first base layer 133 and the first emitter layer 134.

The semiconductor material of the optional window layer 135, which may be epitaxially grown on the first emitter layer 134, is of a first alloy of GaAs, such as AlGaAs or, more particularly, $Al_xGa_{1-x}As$, with the relative aluminum content x>50%, for example x=80%. The window layer 135 has the same or higher p-type conductivity as the first emitter layer 134. The AlGaAs is selected because of its transparency to the selected wavelengths of radiation at which the PPC 50 operates, and for passivation of the first emitter layer 134 so as to reduce the rate of non-radiative recombination of the photo-induced carriers on the interface of the first emitter layer 134 with the following layer. The window layer 135 may have an acceptor concentration of $5\times10^{18}$ cm$^{-3}$ and a thickness in the range of 0.02 and 0.1 μm, for example 0.08 μm.

The conducting layer 136 may be a highly p-doped layer with an acceptor impurity concentration level in the range of $2\times10^{18}$ cm$^{-3}$ to $2\times10^{19}$ cm$^{-3}$, and preferably $3\times10^{18}$ cm$^{-3}$ or greater, so as to reduce the sheet resistance of the conducting layer 136. The semiconductor material of the conducting layer 136 may be a second alloy of aluminum gallium arsenide, such as $Al_xGa_{1-x}As$, with the aluminum content preferably less than 50%, for example 20%, and a thickness in the range of 1 to 3 μm, for example 2 μm. The aluminum content x of the second alloy of AlGaAs of the conducting layer 136 should be sufficiently high to ensure the transparency of the conducting layer 136 to the incident radiation of the selected wavelength. On the other hand, reducing the aluminum content in the conducting layer is beneficial for reducing the sheet resistance thereof as it reduces the undesirable oxidization of the layer.

Therefore, an alternative embodiment of the invention utilizes an aluminum free conducting layer 136 such as a p-doped layer of an alloy of InGaP, for example having a material composition $In_xGa_{1-x}P$ with x in the range of 0.5 to 0.54. Such a layer can be epitaxially grown either over the window layer 135 of the first alloy of AlGaAs with a high Al content over 50%, or can be directly grown on the first emitter layer of p-doped GaAs 134.

Another aspect of the present invention relates to the use of carbon (C) as the preferred doping material that is utilized in preferred embodiments of the invention for the p-doped layers of the PPC 50, such as the current blocking layer 131, the first emitter layer 134, the optional window layer 135, and the conducting layer 136, instead of more traditional p-doping materials such as beryllium (Be) and zinc (Zn) that are typically used in GaAs and InP-based optoelectronic devices. Advantageously, the use of carbon doping enables to strengthen the electrical field in the p-doped emitter layer 134 and across the p-n junction region 129, and increase the internal quantum efficiency of the PPC. Traditional dopants, such as zinc, have possible detrimental effects associated with high doping levels greater than 5e17, such as the decrease in a minority carrier lifetime, whereas carbon doping is not associated with these effects, or at least to a considerably lesser degree. Carbon doping enables the highly doped GaAs or InGaAs to preserve good minority carrier lifetimes and hence contributes to a high quantum efficiency in the active layers 133/134, i.e. a high proportion of photo-generated electron and holes that leave the p-n junction region 129 without non-radiatively recombining therein. Accordingly, using carbon as the doping material, the p-doping level of the emitter layer 134 may be as high as $5 \times 10^{18}$ cm$^{-3}$ without substantially decreasing the quantum efficiency of the device. Contrary to that, the use of conventional doping materials such as Zn at high doping levels, for example greater than $2 \times 10^{18}$ cm$^{-3}$, in the p-layer of the p-n junction 129 may lead to the addition of non-radiative recombination centers and a decreased minority carrier life time, resulting in a lowering of the quantum efficiency and thus smaller photocurrents and/or output voltages that the PPC can produce. Furthermore, spatial distribution of carbon within the semiconductor host material is more stable than that of conventional acceptor impurities such as Zn and Be. By being stable, the carbon doping enables sharper, high gradient interface to be formed between the p-type and the n-type portions of the p-n junction region 129, contributing to a stronger electrical field associated with the p-n junction and a better efficiency with which the photo-generated minority carriers are pulled from the p-n junction 129 to contribute to the photocurrent. The carbon doping of the conducting layer 136 enables a reduced sheet resistance of the conducting layer 136 by providing a higher quality material at elevated doping levels, especially in combination with aluminum-less InGaP material of the conducing layer 16.

The aforedescribed embodiment, wherein the semiconductor material of the base layer 133 and the emitter layer 134 is GaAs, is directed to the optical to electrical power conversion of light having wavelengths in the range of 0.8 to 0.9 μm, as defined by the GaAs energy bandgap and the AlGaAs/InGaP energy bandgap of the conducting layer. One skilled in the art would appreciate however that light of shorter or longer wavelengths can be converted using the PPC 50 by utilizing alloys of AlGaAs or InGaAs lattice matched to the GaAs substrate as the buffer and emitter layers 133, 134, and suitably adjusting the material composition of the conducting layer 136. For example, an alloy of $Al_xGa_{(1-x)}As$ with the Al content x from 5% to 35% may be utilized for the first active layers 133, 134, and another alloy of $Al_xGa_{(1-x)}As$ with a higher concentration of Al or an alloy of InGaP having a higher bandgap than the material of the first active layers 133, 134 may be used for the conducting layer 136. By utilizing alloys of AlGaAs or InGaAs grown over the GaAs substrate as the first active layers 133/134, the PPC 50 may be manufactured that is sutable for power conversion of light in the wavelength range from about 0.7 μm to about 1.3 μm. The energy band gap of the conducting layer 136 may be between 0.15 and 0.5 eV greater than the energy band gap of the emitter layer 134 so as to ensure the transparency of the conducting layer 136 for the incident light that is absorbed in the first active layers 133/134.

Other embodiments of the PPC 50 utilize a layer structure that is epitaxially grown on indium phosphate (InP) substrates, and are suitable for converting light at wavelengths in the 1.2 μm-1.6 μm range, where most commercial optical fibers has a low optical loss. By way of example, in one such embodiment the PPC 50 may utilize the following semiconductor materials in its layer structure. The semiconductor material of the substrate 130 is a semi-insulating InP doped with Iron (Fe) to $10^{16}$ cm$^{-3}$ and has a high resistivity of $10^7$ ohm-cm. The current blocking layer 131 is a layer of p-doped InP having a thickness in the range of 0.2 to 0.3 μm, for example 0.25 μm, and doping level of $5 \times 10^{17}$ cm$^{-3}$ or greater; the buffer layer 132 is a layer of n-doped InP having a thickness in the range of 5 to 10 μm, for example 7 μm, and a donor impurity concentration of $5 \times 10^{17}$ or greater; the semiconductor material of the first base layer 133 is an n-doped alloy of InGaAs that is lattice-matched to InP and has a thickness in the range of 1 to 3 μm, for example 3 μm, and a donor impurity concentration of $5 \times 10^{17}$ or greater; the first emitter layer 134 is a p-doped layer of one of an alloy of InGaAs that is lattice-matched to InP and has a thickness in the range of 0.5 to 1.5 μm, for example 1 μm, and an acceptor impurity concentration in the range of $2 \times 10^{18}$ cm$^{-3}$ to $1 \times 10^{19}$ cm$^{-3}$, or preferably in the range of $3 \times 10^{18}$ cm$^{-3}$ to $5 \times 10^{18}$ cm$^{-3}$, with carbon as the preferred doping material; the conducting layer 136 is a p-doped layer of InP, and has a thickness in the range of 1.5 to 2.5 μm, for example 2 μm, and an acceptor impurity concentration in the range of $2 \times 10^{18}$ cm$^{-3}$ to $2 \times 10^{19}$ cm$^{-3}$, and preferably greater than $3 \times 10^{18}$. The doping material for the p-doped InP layers 131, 136 can be, for example, beryllium (Be). The semiconductor material of the contact layer 101 is p-doped InGaAs, with carbon as a preferred doping material, and the doping level approximately $2 \times 10^{18}$ cm$^{-3}$ or greater, and a thickness of 0.1 to 0.2 μm.

Turning now back to FIG. 3, the device segments 51-55 of the PPC 50 are fabricated in a PPC wafer of the aforedescribed layer structure by forming the trenches 100, 200 which extend through the first multiplayer structure 30, the current blocking layer 131, and partially extend into the substrate 130, so that the device sections 51-55 are electrically and spatially separated from each other and supported by the substrate that is at least semi-insulating, i.e. has a resistivity of no less than $10^7$ ohm-cm so as to reduce, in cooperation with the current blocking layer 131, leakage currents between the device segments.

The depth of the trenches is defined by the total thickness of the first multi-layer structure 30, and may be in the range of 10 to 20 μm. An aspect ratio of trenches 100, 200, which is defined as the ratio of the trench depth 575 to the trench width 575 as indicated with respectively labeled arrows in FIG. 4, should be suitably high so as to minimize the fraction of the incident light that reaches the substrate material at the bottom of the trenches, since said light may get absorbed in the substrate material generating photo-carriers and thereby causing an undesirable increase in the substrate conductance, thus potentially causing a conductance path to be created in the substrate between the device segments, leading to a reduction in the light conversion efficiency of the PPC. Therefore the trenches 100, 200 should be suitably narrow, with the trench width 573 preferably in the range between 2 μm and 10 μm, for example 5 μm or less, with the aspect ratio greater than 4 and preferably greater than 5. The current blocking layer 131 blocks the majority carriers of the buffer layer 132 from flowing into the substrate, thereby preventing leakage currents between the device segments through the substrate 130 from occurring, resulting in a considerable improvement in the light conversion efficiency of the PPC 50 compared to a similar device in the absence of the current blocking layer 131. The terms light conversion efficiency and power conversion efficiency are used herein interchangeably to mean the ratio of electrical power provided by the PPC to an external electrical circuit to the optical power of light incident on the PPC.

In each of the device segments 51-55, a first metal contact 65 is disposed on the first base layer 133 in electrical communication therewith, and a second metal contact 60 is disposed on the optional cap layer 101 or, in the absence of such layer, directly on the conducting layer 136, to be in electrical communication with the first emitter layer 134. Electrical interconnects 70 in the form of metallic air bridges are then formed to connect each but one of the first metal contacts 65 to a second metal contact of an adjacent device segment so that all the device segments 51-55 are connected in series. When light of selected wavelengths in the absorption range of the first active layers 133/134 and the transmission range of the conducting layer 136 is incident upon the PPC 50, voltages that are developed across the p-n junction region 129 of each of the device segments 51-55 are added so as to produce a higher summed voltage $V_{out}$ between the first and second metal contacts that remain unconnected to any of the other first and second metal contacts. These first and second metal contacts that remain unconnected to metal contacts of other segments are referred to herein as base and emitter electrical contacts, respectively; they may be connected with air bridges 71 to the contact pads 61 and 62 to assist in connecting the PPC 50 to an external circuit.

As illustrated in FIG.3 by way of example, the second metal contact 60 of the device segment 51 may be connected with the air bridge 70 to the first metal contact 65 of the device segment 52, as further shown in a cross-sectional view in FIG. 4. The second metal contact 60 of this device segment 51 may be connected with an air bridge to the first metal contact 65 of the central segment 55, with the second metal contact thereof 60 being connected to the first metal contact 65 of the device segment 53. The first and second contacts 65, 60 of the central segment 55 have both the shape of a ring and are referred to hereinafter as the first and second ring contacts. They are located at the circumference of the central segment 55, with the first ring contact 65 being adjacent to the circular trench 200 and the second ring contact 60 located within the central segment 55 next to the first ring contact 65 that is located in the opening 73, as illustrated in FIG. 5, which shows a cross-sectional view of another portion of the PPC 50 along the 'B-B' line indicated in FIG. 3. The first ring contact 65 has a gap 61 therein over which the air bridge 70 connects the second ring contact 60 to the first metal contact 65 of the next device segment 53, the second metal contact of which is connected with another air bridge 70 to the first metal contact 65 of the last device segment 54. This interconnect configuration results in the device segments 51, 52, 55, 53, and 54 being serially connected in the stated order, with the output voltage $V_{out}$ that is developed under suitable illumination between the emitter and base electrical contacts, i.e. between the second metal contact 65 of the device segment 54 and the first metal contact 60 of the device segment 51, being approximately the sum of voltages developed across the p-n junctions 129 of each of the device segments 51-55. The metal pads 61 and 62, to which the remaining metal contacts of the device segments 54 and 51 are connected with the air bridges 71, serve as anode and cathode terminals of the PPC 50, respectively.

The first and second metal contacts 65, 60 can be deposited in a single metallization step, that may be followed by a contact patterning step and a fabrication of the air bridges 70, 71, for example as described in the Virshup patent. The second metal contacts 60 in the outer device segments 51-54 are preferably deposited so as to overlap with one of the metal grid lines on the cap layer 101, while the central segment 55 may not have any grid lines and the respective second ring contact 60 is deposited directly on the contact cap layer 101. The widths of the first and second ring contacts 65, 60 of the central segment 55 should be suitably small as to leave most of the surface area of the contact layer 101 of the central segment 55 open to the incident light. By way of example, the diameter of a circle that defines the outer circumference of the ring segments 51-54 is 1800 μm, the diameter of the central circular segment 55 is 250 μm, and each of the ring contacts 65, 60 has a width in the range of 10 to 50 μm.

Prior to depositing the first metal contact 65, a portion of the first base layer 133 in each device segment is exposed at a selected location of the respective device segment preferably near a trench separating it from an adjacent device section, by selectively etching away a top portion of the multilayer structure 30 up to the first base layer 133 so as to form an opening 73 in the first emitter layer 134 wherein the first metal contact 65 is then deposited, as illustrated in FIG. 4 which shows a cross-sectional view of a portion of the PPC 50 along the 'A-A' line indicated in FIG. 3.

Figure 1:
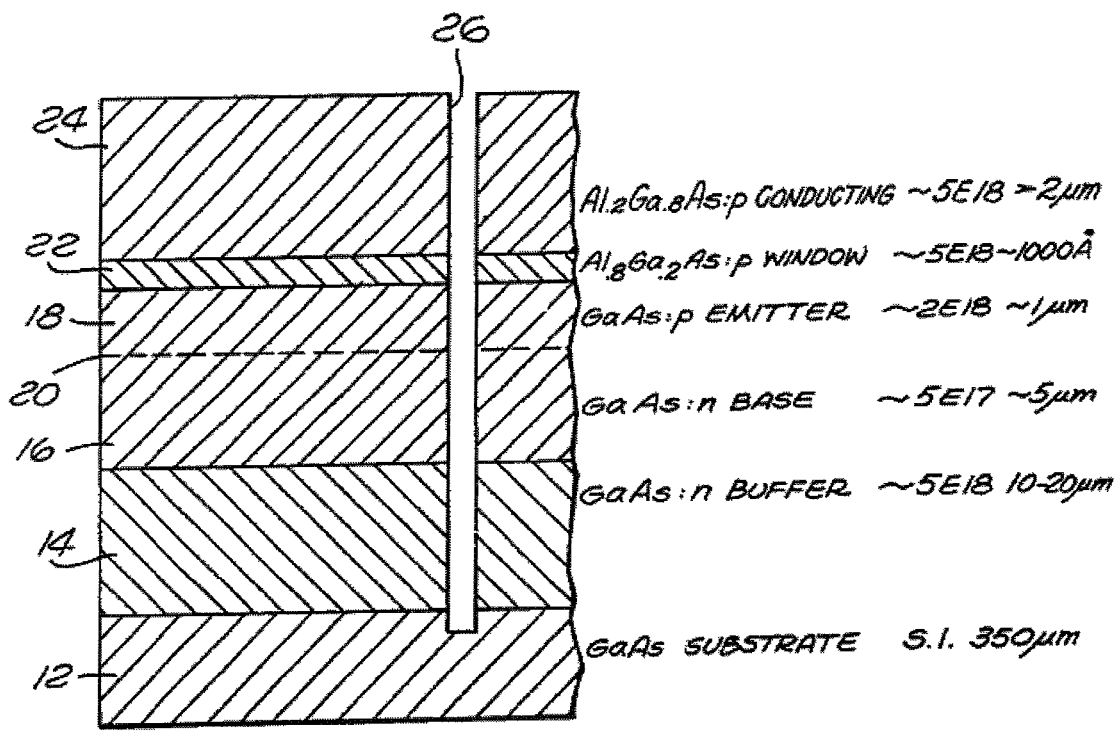
FIG. 1 is a diagram illustrating a prior art layer structure of a semiconductor optical power converter.

The device segments layout of the PPC 50, wherein one device segment 55 is centrally located and surrounded by a group of device segments 51-54 that are disposed at the circumference of the central segment 55, is a novel feature of the present invention that advantageously provides for a higher optical power conversion efficiency as compared to the prior art "pie-wedge" layout of FIG. 1, wherein the trenches 26 all converge in the center of the PPC effectively forming a hole in the center of the photosensitive surface of the device. This prior art layout may significantly reduce the conversion efficiency of the prior art optical power converters in applications wherein the incident light is in the form of a beam which intensity reduces away from the beam axis, such as the Gaussian or near-Gaussian beams emanating from single mode optical fibers. Advantageously, the PPC 50 of the present invention eliminates this drawback of the prior art devices by utilizing a centrally located device segment 55, which enables to utilize light at the center of the incident beam where light intensity is maximal. By "tailoring" the geometry of the PPC segments to the light input density distribution, negative effects of an uneven illumination pattern may largely be avoided. We found that, by utilizing a suitably dimensioned central device segment 55, the power conversion efficiency of the PPC 50 can be increased by up to 25% for a PPC with 5 device segments. We also found that for efficiently converting the optical power of a Gaussian beam into electrical power, the central segment 55 should preferably have a photosensitive surface having an area between 15% and 25%, and more preferably about 20%, of the total area of the photosensitive surface of the PPC 50. However, in applications wherein the intensity of the incident light is substantially uniform across the photosensitive surface of the PPC 50, the photosensitive surfaces of the device segments 51-55 should be equal in area. Note that the term "photosensitive surface" is used herein to refer to the surface of the PPC through which the incident light reaches the active layers of the device where it is absorbed and converted to electricity. The photosensitive surface of the PPC 50 is a portion of the total light receiving surface of all the device segments 51-55, as shown in FIG. 3, that is not covered by metal. The term "photosensitive area" is used herein to refer to an area of the respective photosensitive surface. Another advantage provided by the central segment 55 is the reduction of the undesirable voltage drop in the device associated with the resistive path the carriers generated at the device center have to travel to reach the contact pads 61, 62. By capturing the light in a centrally located segment, the current does not have to travel a long distance through resistive material, but can be collected directly near the central segment and fed out via metallic grid lines having low resistance to the perimeter of the device. In the prior art, there were no means of the collections of the current from the inner portion of the device.

Figure 6:
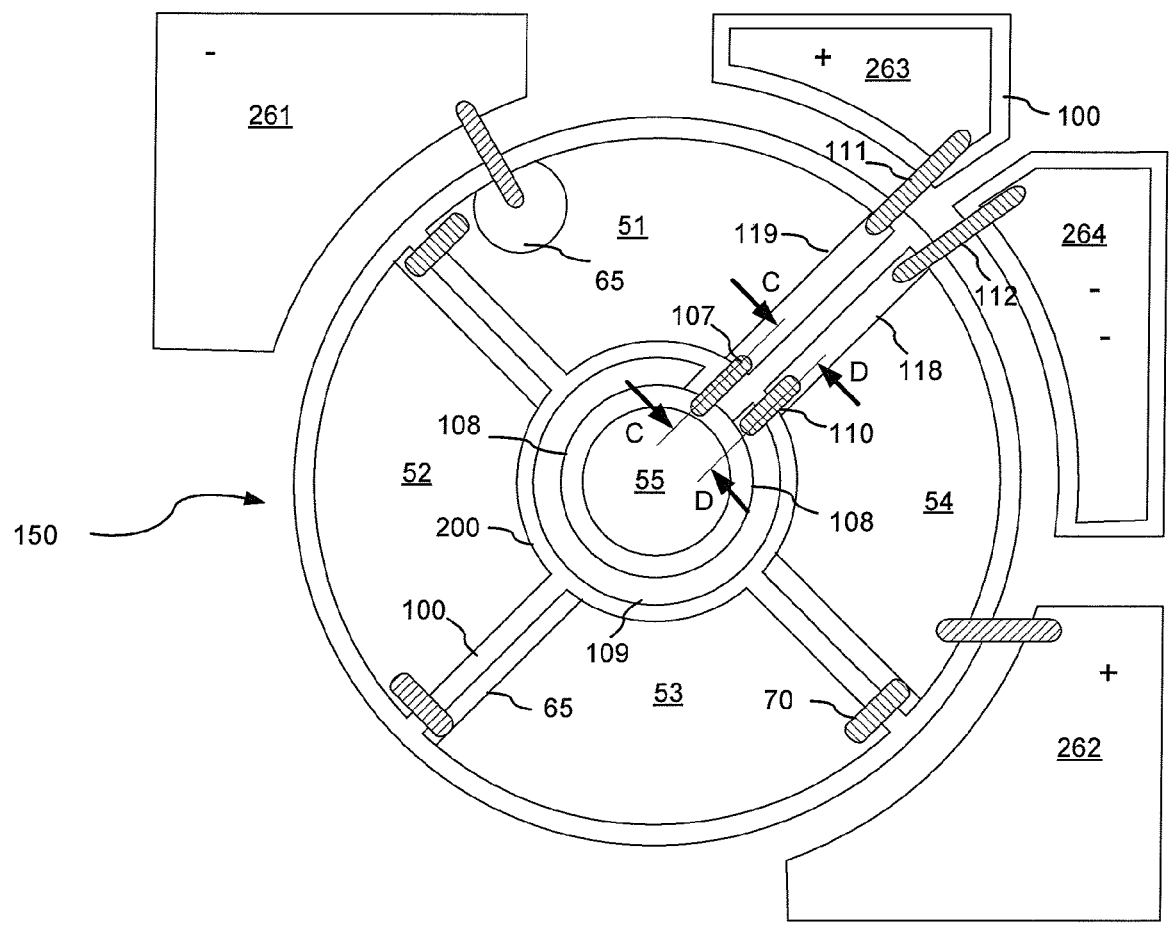
FIG. 6 is a plan view of a photovoltaic power converter having an independently addressable center section.

Referring now to FIG. 6, another embodiment of the invention provides a PPC 150, wherein the central segment 55 is connected independently of the ring segments 51-54 and is electrically isolated therefrom. The PPC 150 is now a four-port device, having a first device portion embodied by the central device segment 55, which is electrically isolated from a second device portion as embodied by the ring segments 51-54, and can be electrically addressed independently therefrom. The ring segments 51-54 are connected in series between the contact pads 261 and 262, and form a section of the PPC 150 that is referred to herein as the ring device section or simply as the ring section. Note that in FIGS. 3-7 like numerals are used to indicate like elements to simplify the description and assist in understanding of the shown embodiments, with the exception that the first and second ring contacts of the central segment 55 are now labeled with reference numerals 109 and 108, respectively to distinguish them from the first and second metal contacts 65, 60 of the ring segments 51-55. Instead of being connected to the first and second metal contacts of respective ring segments as in the PPC 50, the first and second ring contacts 109, 108 of the central segment 55 of the PPC 150 are connect to contact pads 263 and 264 by means of conducting pathways 118 and 119 that are preferably less than 15 µm wide, are located next to a trench 100 separating two ring segments of the device. The conducting pathways 118 and 119 are disposed over the device segments 51 and 54 extending from the inner to outer circumference thereof, but are insulated therefrom by a second current blocking layer 106, which is epitaxially grown on the cap layer 101 and has a conductivity type that is opposite to the conductivity of the cap layer 101. The conducting pathways 118 and 119 are also referred to herein as the third and forth metal contacts, respectively. They extend outwardly across the ring device section and are electrically insulated from the device segments thereof for connecting to an external circuit independently of the device segments 51-54 of the ring section.

Figure 7:
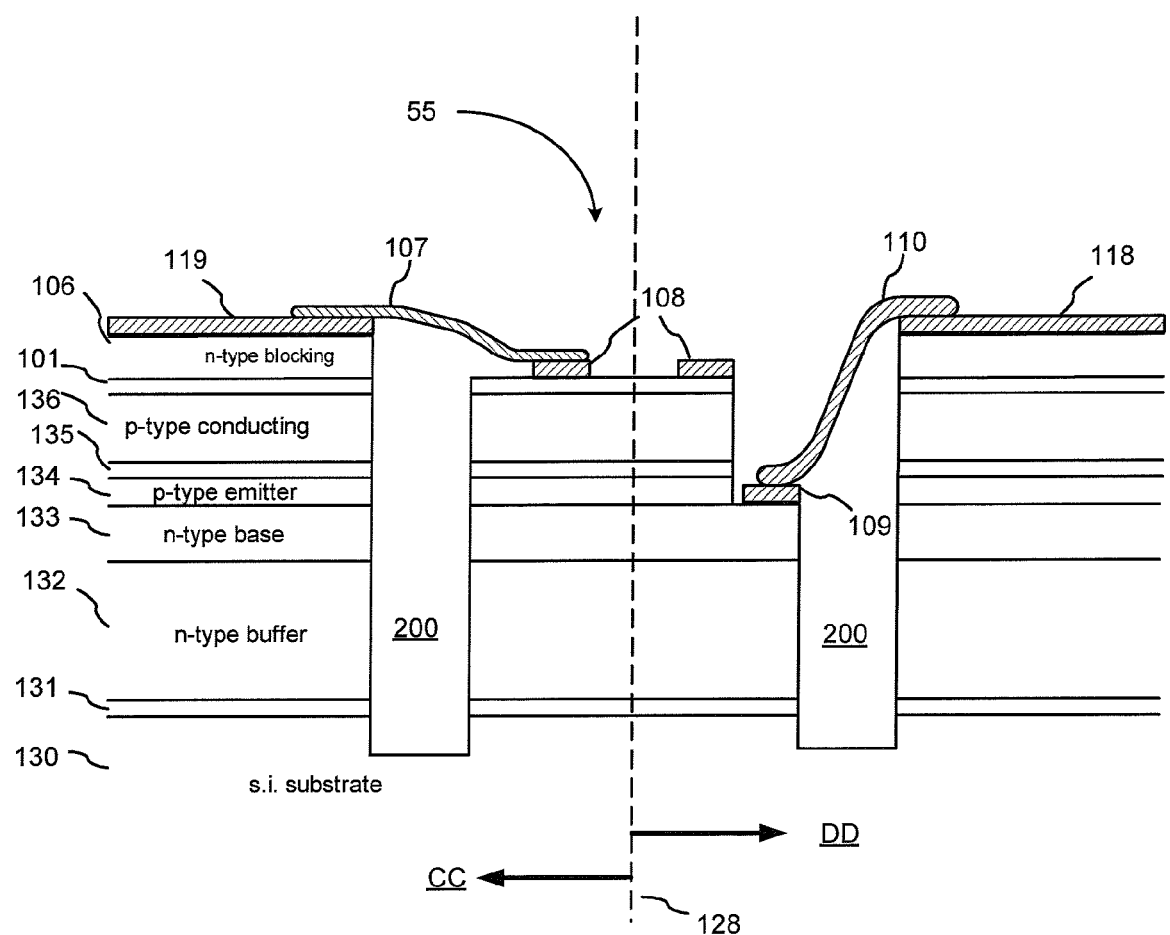
FIG. 7 provides cross-sectional views of an exemplary embodiment of the photovoltaic power converter of FIG. 6 as taken along lines C-C and D-D of FIG. 6.

This second current blocking layer is illustrated in FIG. 7, showing cross-sectional views of portions of the PPC 150 along the lines 'C-C' (to the left of a dashed line 128), and 'D-D' (to the right of the dashed line 128). In the aforedescribed embodiment wherein the semiconductor material of the substrate 130 and the first active layers 133/134 is GaAs, and the conducting and cap layers 136, 101 are p-type, the second current blocking layer 106 may be an n-doped GaAs with a doping level of at least $5 \times 10^{17}$ cm$^{-3}$ and a thickness in the range of 1 to 5 µm. The pathways 119, 118 can be formed in the same or separate metallization step as the first and second metal contacts 65, 60 followed by a contact patterning step, after which the second blocking layer 106 is removed everywhere except for directly under the narrow metal pathways 118, 119.

The device segments 51-54 are connected in series by the air bridges 70 between the contact pads 261 and 262, with the first metal contact 65 of each of the device segments 51-54, except for the device segment 51, connected to the second metal contact 60 of a next adjacent ring device segment so at to form a serially connected chain of device segments 51-54, with the first metal contact 65 of the first device segment 51 in the chain connected to the contact pad 261 with a first air bridge 71, and the second metal contact 60 of the device segment 54 connected to the contact pad 262 with the second air bridge 71. The contact pads 263 and 264 function as anode and cathode terminals of the first, or central portion 55 of the PPC 150, while the contact pads 261 and 262 function as the anode and cathode terminals of the second, or ring portion of the PPC 150 comprised of the serially connected ring device segments 51-54.

Advantageously, the PPC 150 can function as an integrated device combining a PPC and a more conventional photodetector (PD), with a PPC portion of the device corresponding to the ring portion 51-54, and the PD portion of the device corresponding to the central portion 55. When illuminated by light of suitable wavelengths having a modulation component carrying data, the PPC 150 can provide both electrical power in the form of a 5V or higher voltage signal across the device terminals 261, 262 to be used, for example, for driving external electrical circuitry, and a detected data at the terminals 263, 264. Moreover, the central portion 55 of the device can be forward biased using the anode and cathode terminals 263, 264 thereof, forcing its active layers 133/134 to emit rather than absorb light, so that the central portion of the PPC 150 can function as an LED, for example to transmit rather than detect optical data.

Accordingly, this aspect of the invention provides a four port PPC that has two independently addressable portions, as opposed to the prior art optical power converter of FIG. 1 and the novel PPC 50 of the present invention, which both are two-port devices. Advantageously, the independently addressable portions of the PPC 150 can be used to perform two different functions, for example to perform optical power conversion and optical data reception or transmission simultaneously within the same device.

In the embodiment of FIG. 7, the central and ring portions of the PPC 150 utilize different spatial regions of the same p-n junction 129 to detect or emit light, and to convert light into electrical power, respectively. However, the p-n junction 129 may not be optimal for receiving or emitting optical data signals, i.e. for perfoiming the LED and PD functions. Moreover, in some applications the optical data signal and the optical power can be carried by different wavelengths of light.

Figure 8:
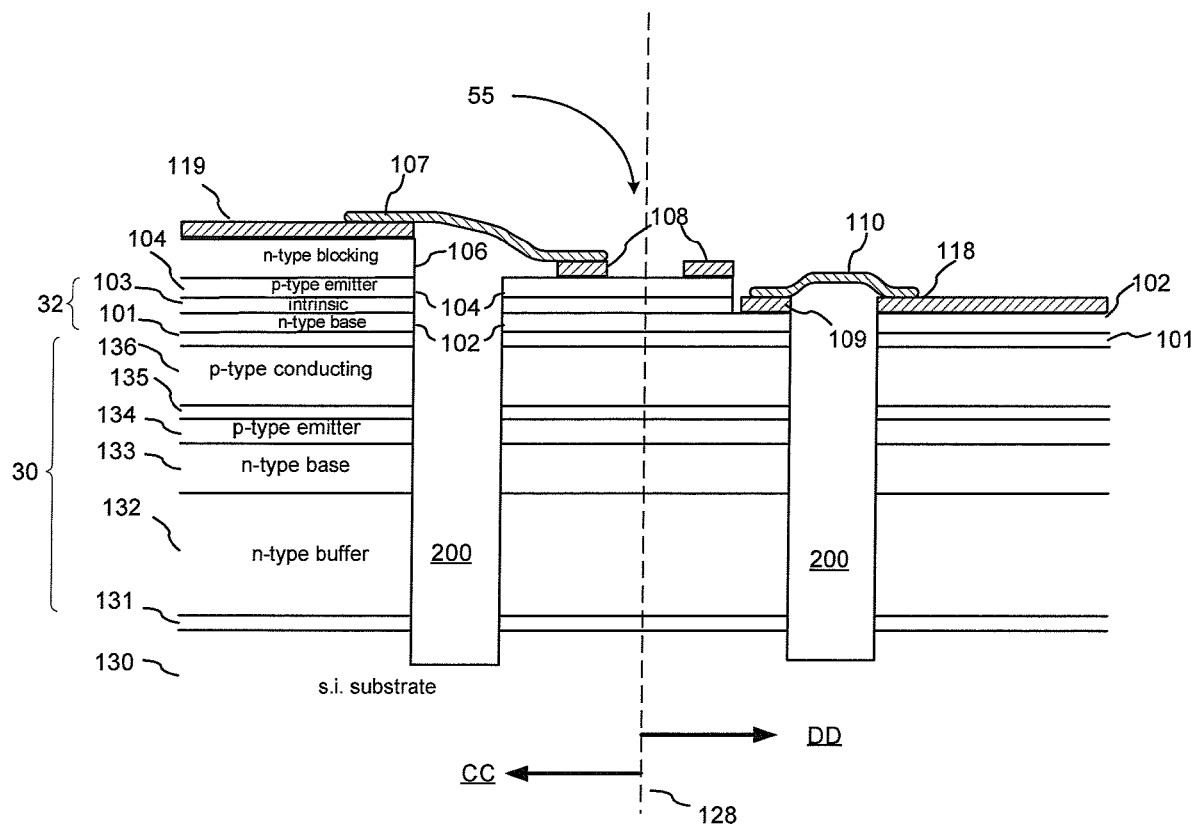
FIG. 8 provides cross-sectional views of an alternative embodiment of the photovoltaic power converter of FIG. 6 as taken along lines C-C and D-D of FIG. 6.

With reference to FIG. 8, another embodiment the PPC 150 includes a second multiplayer structure 32, for example of a p-i-n type, disposed on the first multilayer structure 30 within center segment 55, which may be optimized for operating as a PD or an LED. This second multilayer structure 30 may include a second base layer 102 of the first conductivity type epitaxially grown on the cap layer 101, followed by an undoped or intrinsic layer 103 epitaxially grown on the second base layer 102, and a second emitter layer 104 of the second conductivity type epitaxially grown over the intrinsic layer 103. The second current blocking layer 106 is then epitaxially grown on top of the second emitter layer 104. After forming the conducting pathways 118, 119 using metallization and patterning steps, the second current blocking layer 106 is removed everywhere except under the conducting pathways 118, 119, where it provides electrical insulation from the underlying semiconductor structure.

The second multilayer structure 32 is kept within the central segment 55, but may be removed everywhere within the ring segments 51-54, except from under the pathways 118, 119. The first ring contacts 109 of the central segment 55 is disposed on an exposed portion of the second base layer 102 in an opening in the intrinsic and second emitter layers 103, 104 as shown to the right of the dashed line 128 in FIG. 8, to be in electrical communication with the second base layer 102. The second ring contact 108 of the central segment 55 is disposed on the second emitter layer 104 to be in electrical communication therewith. In the illustrated embodiment wherein the second emitter layer 104 is p-type and the second base layer 102 is n-type, the first ring contact 109 and the second ring contact 108 may be formed using known in the art n-type and p-type metallization techniques, respectively, for example an Au/Ge/Au metallization or the n-type metal contacts 108, 118, 119, and 65, and Ti/Pt/Au metallization for the p-type metal contacts 109 and 60. The metal air bridge 107 connects the second emitter layer 104 via the second ring contact 108 to the conducting pathway 119, which is in turn connected with the air bridge 111 to the anode terminal 263 of the p-i-n structure of the central portion 55 of the PPC 150. Similarly, the metal air bridge 111 connects the second base layer 102 via the first ring contact 109 to the conducting pathway 118, which is in turn connected with the air bridge 112 to the cathode terminal 264 of the p-i-n structure of the central portion 55 of the PPC 150. The anode and cathode terminals 263, 264 are separated from the rest of the device by the etched trenches 100 which are bridged with the air bridges 111 and 112.

By way of example, in a GaAs based device having the first multilayer structure as described hereinabove, the semiconductor material of the second base layer 102 can be n-doped GaAs having a donor impurity concentration of approximately $5 \times 10^{17}$ cm$^{-3}$ to $2 \times 10^{18}$ cm$^{-3}$ and a thickness in the range of 1 to 5 microns for example 3 μm, the semiconductor material of the intrinsic layer 103 can be undoped GaAs having a background doping level preferably less than $10^{16}$ cm$^{-3}$ and a thickness in the range of 0.5 to 1.5 microns for example 0.8 μm, and the semiconductor material of the second emitter layer 104 can be p-doped GaAs having an acceptor impurity concentration of approximately $5 \times 10^{17}$ cm$^{-3}$ to $2 \times 10^{18}$ cm$^{-3}$ and a thickness in the range of 0.5 to 1 microns for example 0.8 μm. The second current blocking layer 106 may be again n-doped GaAs having a donor impurity concentration of approximately $5 \times 10^{17}$ cm$^{-3}$ to $2 \times 10^{18}$ cm$^{-3}$ and a thickness in the range of 0.5 to 2 microns, for example 1.0 μm. In other GaAs based embodiments of the PPC 150, the second multilayer structure 32 can utilize an alloy of AlGaAs or InGaAs and have a wider or narrower energy bandgap than that of the first active layers 133/134, so as to absorb and convert into photo-carriers a different set of wavelengths than is absorbed in the active layers of the ring segments 51-54. Such embodiments can be advantageous in applications wherein the optical power and data are delivered by light of differing wavelengths.

In another exemplary embodiment, the semiconductor material of the substrate 130 is the semi-insulating InP, with the layers 131-136 and 101 as described hereinabove with reference to the InP based embodiment of the PPC 50, with the first active layers 133/134 of an alloy of InGaAs lattice matched to InP and having an energy bandgap corresponding to a wavelengths of approximately 1.48 μm. In this embodiment of the PPC 150 the semiconductor material of the second base layer 102 may be an n-doped alloy of InGaAsP with the alloy composition such as to have an energy band gap corresponding to a wavelength of 1.3 μm, having a donor impurity concentration of approximately $1 \times 10^{18}$ cm$^{-3}$ and a thickness in the range of 1 to 3 microns for example 2 μm. The semiconductor material of the intrinsic layer 103 may be an undoped alloy of InGaAsP of the same alloy composition as the second base layer 102 having a thickness of in the rage of 0.5 to 1.5 μm, for example about 1 μm, and the semiconductor material of the second emitter layer 104 can be p-doped InGaAsP of the same alloy composition as the second base layer 102 and having an acceptor impurity concentration in the range of $5 \times 10^{17}$ to $5 \times 10^{18}$ cm−3 or approximately $2 \times 10^{18}$ cm$^{-3}$ and a thickness in the range of 0.5 to 1.5 μm or approximately 1 μm. The second current blocking layer 106 may be n-doped InGaAs having a donor impurity concentration of approximately $5 \times 10^{18}$ cm$^{-3}$ to $2 \times 10^{19}$ cm$^{-3}$ and a thickness of 0.2 microns. This embodiment of the PPC 150 is suitable for detecting an optical data signal at a 1.3 μm wavelength, and for converting into electrical power light from a high-power laser operating at 1480 nm, such as a 1480 nm diode pump laser. The doping material of the InP and InGaAsP device layers may be Zn or Be.

One skilled in the art would appreciate that different combinations of ternary materials such as InGaAs and InGaP and quaternary materials such as different alloys of InGaAsP can be epitaxially grown over an InP substrate to form the first and second multilayer structures 30, 32, resulting in various embodiments of the PPC 150 operating in a range of wavelengths from about 1.2 μm to about 1.6 μm. Conventional growth techniques such as MBE and MOCVD can be utilized for the epitaxial growth of the ternary and quaternary layers, with metamorphic growth enabling to incorporate lattice-mismatched layers into the layer structure of the PPC without substantially degrading the device performance. By way of another example, the second multilayer structure 32 may utilize an alloy of InGaAsP or InGaP and have a wider or narrower energy bandgap than that of the first active layers 133/134, so as to absorb and convert into photo-carriers a different set of wavelengths than is absorbed in the active layers of the ring segments 51-54. Such embodiments can be advantageous in applications wherein the optical power and data are delivered by light of differing wavelengths.

PPC Measurement Results

Figure 2:
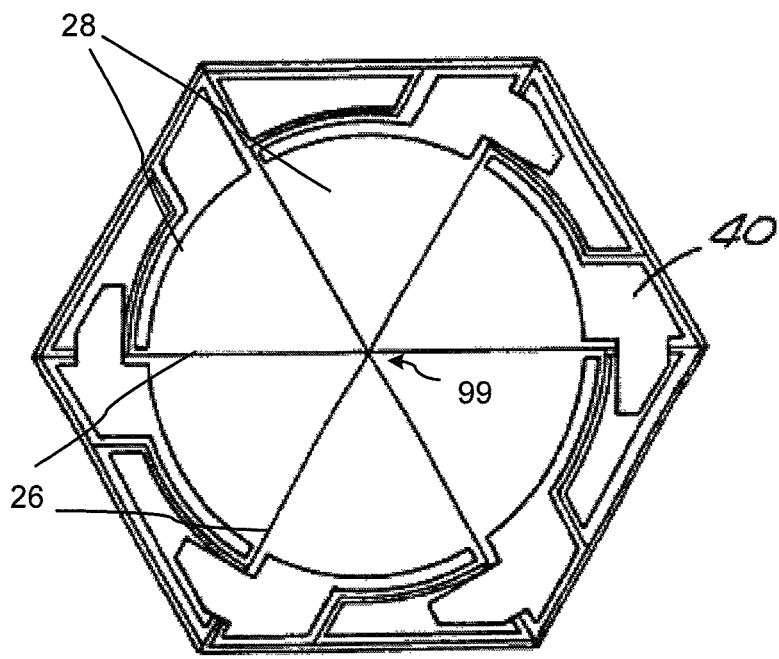
FIG. 2 is a plan view of the prior art segmented semiconductor optical power converter.
Figure 9:
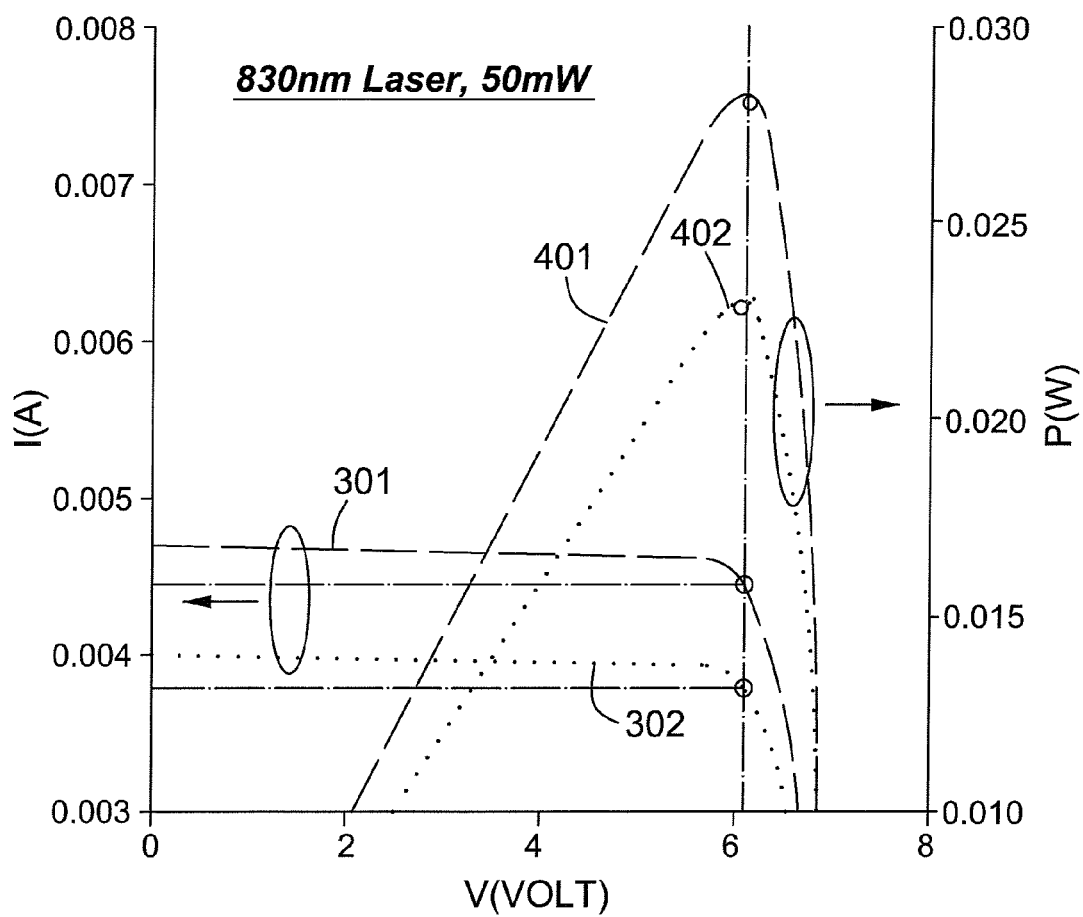
FIG. 9 is a graph showing current-voltage (I-V) and output power-voltage (P-V) characteristics of a GaAs/AlGaAs photovoltaic power converter of the present invention under 50 mW illumination.

FIG. 9 shows a measured I-V characteristic 301 and the P-V characteristic 401 of a GaAs-based PPC 50 of the present invention in comparison with respective I-V characteristic 302 and the power conversion efficiency 402 of the prior-art GaAs-based PPC as shown in FIGS. 1 and 2. The measurements were performed by illuminating the devices with light at a wavelength of 830 nm and optical power of 50 mW. The maximum power conversion efficiency obtained with the GaAs-based PPC 50 of the present invention is approximately 55% vs. the 45% conversion efficiency of the prior art power converter, and occurs at the output voltage $V_{out}$ of approximately 6.3 volts, with the corresponding electrical current being approximately 4.5 milliamps. The improvement in the conversion efficiency and the output current achieved by the PPC 50 of the present invention over the state-of-the-art GaAs-based power converter is almost 25%, with the power conversion efficiency of the PPC of the present invention being close to the theoretical maximum. The improvement may be attributed to the following factors: i) carbon doping of the p-type layers; this includes the improved minority carrier lifetimes in the carbon-doped p-type emitter layer 134, which partly results from the favorable field patterns that arise from the extra-high doping of the window and conducting layers 135, 136 so as to induce an even stronger field for newly photo-generated carriers to be swept across the p-n junction, and the lower sheet resistance of the carbon-doped layers, including the p-type emitter layer, the p-type window layer and the p-type conductivity layer; the lowered sheet resistance improves the achievable voltage while the current remains high, all leading to higher power output; ii) the novel geometry of the device segments that eliminates the hole in the device center by adding the center segment; this leads to better utilization of the available surface area and its interaction with the light intensity profile; and, the addition of the current blocking layer 131, which significantly reduces, and possibly eliminates, any or all photo-induced conductivity between adjacent segments and this, in turn, increases the voltage that is generated under the illumination across each individual device segment.

Figure 10:
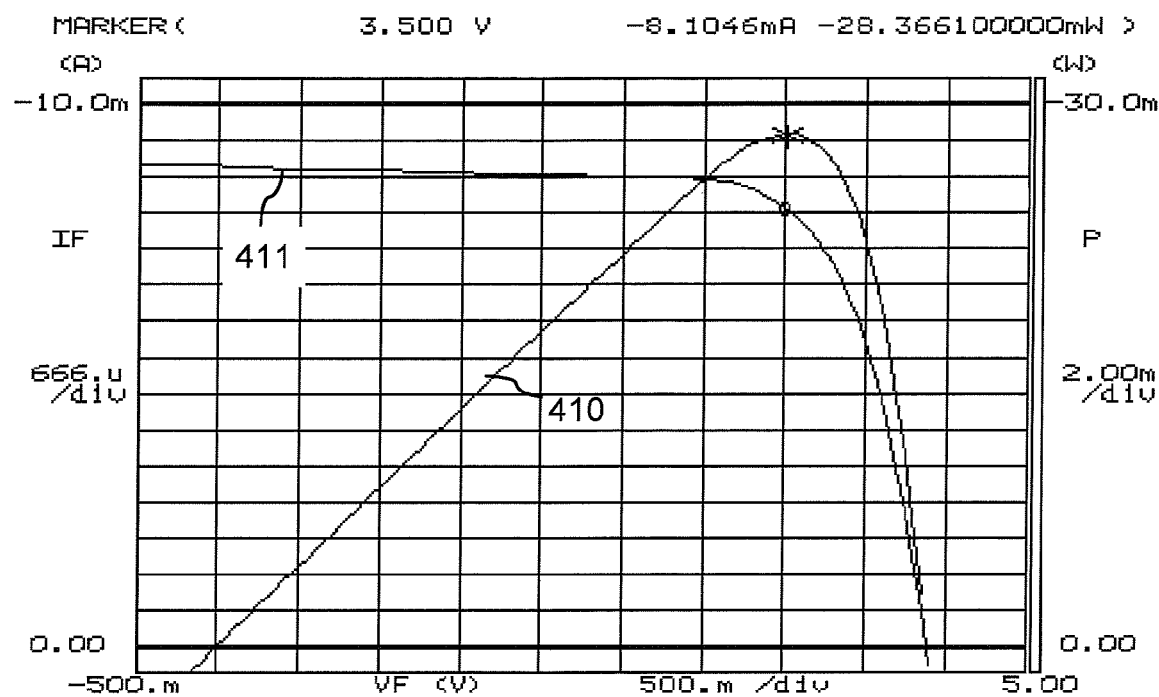
FIG. 10 is a graph showing current-voltage (I-V) and output power-voltage (P-V) characteristics of an InGaAs/InP photovoltaic power converter of the present invention under 1430 nm, 100 mW illumination.

FIG. 10 shows a current-voltage (I-V) characteristic 411 and an output power (P-V) characteristic 410 of an InP-based PPC manufactured according to the present invention, with the first multilayer structure 30 including the InGaAs active layers 133/134 and the InP current blocking layer 131 as described hereinabove. The maximum power conversion efficiency of the device exceeds 28%, and occurs at the output voltage $V_{out}$ of 3.5 volts, with the corresponding output electrical current of 8.1 milliamps The wavelength of the incident light was 1436 nanometers, and its power was 100 mW, providing a maximum output power from the PPC of about 28.4 mW. Such a high power conversion efficiency is a remarkable achievement for optical power converters operating in the 1310-1550 nm wavelength range, significantly exceeding reported performance parameters of all such devices known heretofore. The measured device had 9 wedge-shaped device segments.

Advantageously, the InP-based PPC of the present invention may be used to realize a key objective for the photonic power technology, namely increasing the distance over which optical power can be transmitted with sufficient efficiency for driving remote devices such as sensors and data interfaces. For distances over 1 km, the long wavelength light in the range of 1310 to 1550 nm must be used, due to a relatively high attenuation in optical fiber for wavelengths outside of this range. For shorter wavelengths, for example 980 nm and below, the light attenuation in typical optical fibers is greater than 3 dB/km, which may be prohibitive for optically powering devices at distances greater than a few hundred meters. However, for wavelengths of 1310 nm and above, the attenuation of light in optical fibers is about or less than 0.1 dB/km, making the InP-based PPC of the present invention a more suitable choice of power converter than the GaAs based devices, when optical power needs to be delivered over distances of 1 km or greater. As a further advantage, the PPC of the present invention can be mounted in receptacles suitable for alignment to a single-mode fiber, so that the use of the InP based PPC of the present invention extends the benefits of remote optical powering to longer distances.

Note that the particular embodiments of the photovoltaic power converter of the present invention described hereinabove may utilize portions of other embodiments and are by way of example only, and alternative embodiments of many elements can be employed in particular applications of the invention as would be evident for those skilled in the art. For example, other embodiments of the PPC of the present invention may have device segments that are arranged in a circular pattern wherein a first group of the device segments is centrally positioned and is surrounded by a second group of the device segments comprising at least two device segments. In the embodiment described herein, the first group of the device segments consist of the single device segment 55, but other embodiments may be envisioned where the first group consists of more than one device segments separated by additional trenches, which may also be connected in series or be isolated from each other and individually addressable. Other embodiments may include devices wherein the base layers are p-doped, while the emitter layers are n-doped. In yet other embodiments the second multilayer structure in the central portion of the PPC may be optimized to generate light and may either have no intrinsic layer between the second base and emitter layers, or the intrinsic layer may be less than 0.1 µm thick so that a quantum well structure is formed.

Of course numerous other embodiments may be envisioned without departing from the spirit and scope of the invention.

We claim:

1. A photovoltaic power converter comprising:
   a substrate of a semiconductor material;
   a first multilayer structure supported by the substrate and comprising:
      a first base layer of a semiconductor material of a first conductivity type,
      a first emitter layer of a semiconductor material of a second conductivity type opposite to the first conductivity type disposed over the first base layer so as to form a first p-n junction, and
      a first conducting layer of the second conductivity type disposed over the first emitter layer and having a thickness in the range from about 1 micron to about 3 microns;
   a plurality of trenches extending through the first multilayer structure so as to form a plurality of spatially separate device segments supported by the substrate, the plurality of device segments comprising a center segment that is centrally positioned and two or more ring segments forming a ring device section around the center segment,
   wherein each of the ring segments comprises a first metal contact disposed upon an exposed portion of the first base layer and providing an electrical contact to the first base layer, and a second metal contact disposed upon the first emitter layer and providing an electrical contact to the first emitter layer;
   wherein the center segment comprises a second multilayer structure disposed over the first multilayer structure, the second multilayer structure comprising:
      a second base layer of a semiconductor material of the first conductivity type disposed over the first conducting layer;
      a second emitter layer of a semiconductor material of the second conductivity type disposed over said second base layer so as to form a second p-n junction;
   a third metal contact disposed upon an exposed portion of the second base layer of the center segment and providing an electrical contact thereto;
   a fourth metal contact disposed in the center segment over the second emitter layer for providing an electrical contact thereto;
   electrical interconnects for electrically connecting in series the device segments of the ring section by connecting each but one first metal contact thereof to an adjacent second metal contact, for developing a voltage between two of the device segments of the ring section in response to radiation incident upon the device sections.

2. A photovoltaic power converter according to claim 1, wherein the first conductivity type is n-type, and the second conductivity type is p-type.

3. A photovoltaic power converter according to claim 1, wherein each of the third and fourth metal contacts extend outwardly across the ring device section and are electrically insulated from the device segments thereof for selectively connecting only the second p-n junction to an external circuit independently of the ring segments and of the first p-n junction.

4. A photovoltaic power converter according to claim 3, further comprising one or more current blocking layers interposed between each of the third and fourth contacts and the first multilayer structure within the ring device section.

5. A photovoltaic power converter according to claim 1, further comprising an intrinsic layer of a semiconductor material interposed between the second base layer and the second emitter layer and having an intrinsic conductivity that is lower than conductivities of the second base and emitter layers.

6. A photovoltaic power converter according to claim 1, wherein each of the semiconductor materials of the first base layer and the first emitter layer has a bandgap that is smaller than bandgaps of the semiconductor materials of the second base layer and the second emitter layer.

7. A photovoltaic power converter according to claim 1, wherein the semiconductor materials of the first base layer and the first emitter layer have a bandgap that is equal or greater than bandgaps of the semiconductor materials of the second base layer and the second emitter layer.

8. A photovoltaic power converter according to claim 1, wherein the substrate and each of the first base layer and the first emitter layer comprise GaAs.

9. A photovoltaic power converter according to claim 8, wherein:
the second base layer comprises n-doped GaAs having a donor impurity concentration in the range of $5 \times 10^{17}$ to $2 \times 10^{18}$ cm$^{-3}$ and has a thickness in the range of 1 to 3 μm; and
the second emitter layer comprises p-doped GaAs having an acceptor impurity concentration in the range $5 \times 10^{17}$ to $2 \times 10^{18}$ cm$^{-3}$ and has a thickness in the range of 0.5 to 1.5 μm.

10. A photovoltaic power converter according to claim 5, wherein the semiconductor material of the substrate is GaAs, and wherein the semiconductor material of each of the second base layer, the second emitter layer and the intrinsic layer is an alloy of one of InGaAs and AlGaAs.

11. A photovoltaic power converter according to claim 1, wherein the semiconductor material of the substrate is InP, and the semiconductor material of each of the second base layer, the second emitter layer and the intrinsic layer is an alloy of one of InGaAs and InGaAsP.

12. A photovoltaic power converter according to claim 10, wherein:
the first base layer comprises n-doped GaAs having a donor impurity concentration in the range of $2 \times 10^{17}$ to $2 \times 10^{18}$ cm$^{-3}$ and has a thickness in the range of 1 to 3 μm; and,
the first emitter layer comprises p-doped GaAs having an acceptor impurity concentration in the range of $5 \times 10^{17}$ to $2 \times 10^{19}$ cm$^{-3}$ and has a thickness in the range of 0.2 to 1 μm;
further comprising:
a buffer layer of n-doped GaAs interposed between the substrate and the first base layer having a thickness in the range of 1 to 10 μm and a donor impurity concentration in the range $5 \times^{17}$ to $2 \times 10^{18}$ cm$^{-3}$.

13. A photovoltaic power converter according to claim 11, wherein the first base layer comprises n-doped InGaAs lattice matched to InP and having a donor impurity concentration in the range of $5 \times 10^{17}$ to $1 \times 10^{19}$ cm$^{-3}$, and has a thickness in the range of 1 to 3 μm; and,
the first emitter layer comprises p-doped InGaAs lattice matched to InP and having an acceptor impurity concentration in the range $5 \times 10^{17}$ to $1 \times 10^{19}$ cm$^{-3}$ and has a thickness in the range of 0.5 to 1.5 μm;
further comprising:
a buffer layer of n-doped InP interposed between the substrate and the first base layer having a thickness in the range of 5 to 10 μm and a donor impurity concentration in the range $5 \times 10^{17}$ to $2 \times 10^{18}$ cm$^{-3}$;
a conducting layer of a p-doped InP interposed between the first emitter layer and the second base layer and having a thickness in the range of 1.5 to 2.5 μm and an acceptor impurity concentration in the range $2 \times 10^{18}$ to $2 \times 10^{19}$ cm$^{-3}$.

14. A photovoltaic power converter according to claim 13, wherein the second base layer comprises n-doped InGaAsP having a donor impurity concentration in the range of $5 \times 10^{17}$ to $2 \times 10^{18}$ cm$^{-3}$ and has a thickness in the range of 1 to 2 μm;
the intrinsic layer comprises undoped InGaAsP having a doping level less than $10^{15}$ cm$^{-3}$ and has a thickness in the range of 0.5 to 1.5 rim; and,
the second emitter layer comprises p-doped InGaAsP having an acceptor impurity concentration in the range $5 \times 10^{17}$ to $5 \times 10^{18}$ cm$^{-3}$ and has a thickness in the range of 0.5 to 1.5 μm.

15. A photovoltaic power converter according to claim 1, wherein each of the device segments has a photosensitive surface and wherein the photosensitive surface of the center segment has an area that in the range of 15% to 25% of a total area of the photosensitive surfaces of all of the device segments.

* * * * *